United States Patent [19]

Le Boennec et al.

[11] Patent Number: 5,202,815
[45] Date of Patent: Apr. 13, 1993

[54] PROTECTIVE CASE FOR AN INDUSTRIAL CONTROLLER

[75] Inventors: André Le Boennec, Biviers; Robert Jean, Seyssins; Bernard Dalban, Theys, all of France

[73] Assignee: Merlin Gerin, France

[21] Appl. No.: 784,871

[22] Filed: Oct. 30, 1991

[30] Foreign Application Priority Data

Nov. 14, 1990 [FR] France .................. 90 14243

[51] Int. Cl.⁵ .................................. H05K 7/20
[52] U.S. Cl. .................... 361/384; 174/35 R; 361/420; 361/424; 439/620
[58] Field of Search ........... 174/35 R, 52.1, 138 G; 439/607, 608, 485, 620; 248/500, 503; 361/91, 331, 380, 384, 395, 417, 419, 420, 424

[56] References Cited

U.S. PATENT DOCUMENTS

| | | | |
|---|---|---|---|
| 4,688,135 | 8/1987 | Leopold | 361/118 |
| 4,926,291 | 5/1990 | Sarraf | 361/384 |
| 4,956,750 | 9/1990 | Maggelet . | |
| 5,010,322 | 4/1991 | Fry | 340/700 |
| 5,030,793 | 7/1991 | McCarthy | 174/35 R |
| 5,034,856 | 7/1991 | Cook | 361/424 |
| 5,092,796 | 3/1992 | Simon | 439/673 |

FOREIGN PATENT DOCUMENTS

| | | | |
|---|---|---|---|
| 3135224 | 3/1983 | Fed. Rep. of Germany | 361/415 |
| 2284247 | 4/1976 | France . | |
| 8702214 | 4/1987 | World Int. Prop. O. . | |

Primary Examiner—Gerald P. Tolin
Attorney, Agent, or Firm—Parkhurst, Wendel & Rossi

[57] ABSTRACT

A protective case with an electronic device, including an assembly which includes a support cradle fixed to and supporting the electronic device, a sealed metal housing enclosing the assembly, the support cradle being fixed to the sealed metal housing via mechanical dampers to isolate the assembly from external disturbances including shocks, wherein a gap is formed between the assembly and the sealed metal housing, and a fan fixed to the cradle for generation of air flow in the gap to promote convection heat transfer from the electronic device to the sealed metal housing.

4 Claims, 3 Drawing Sheets

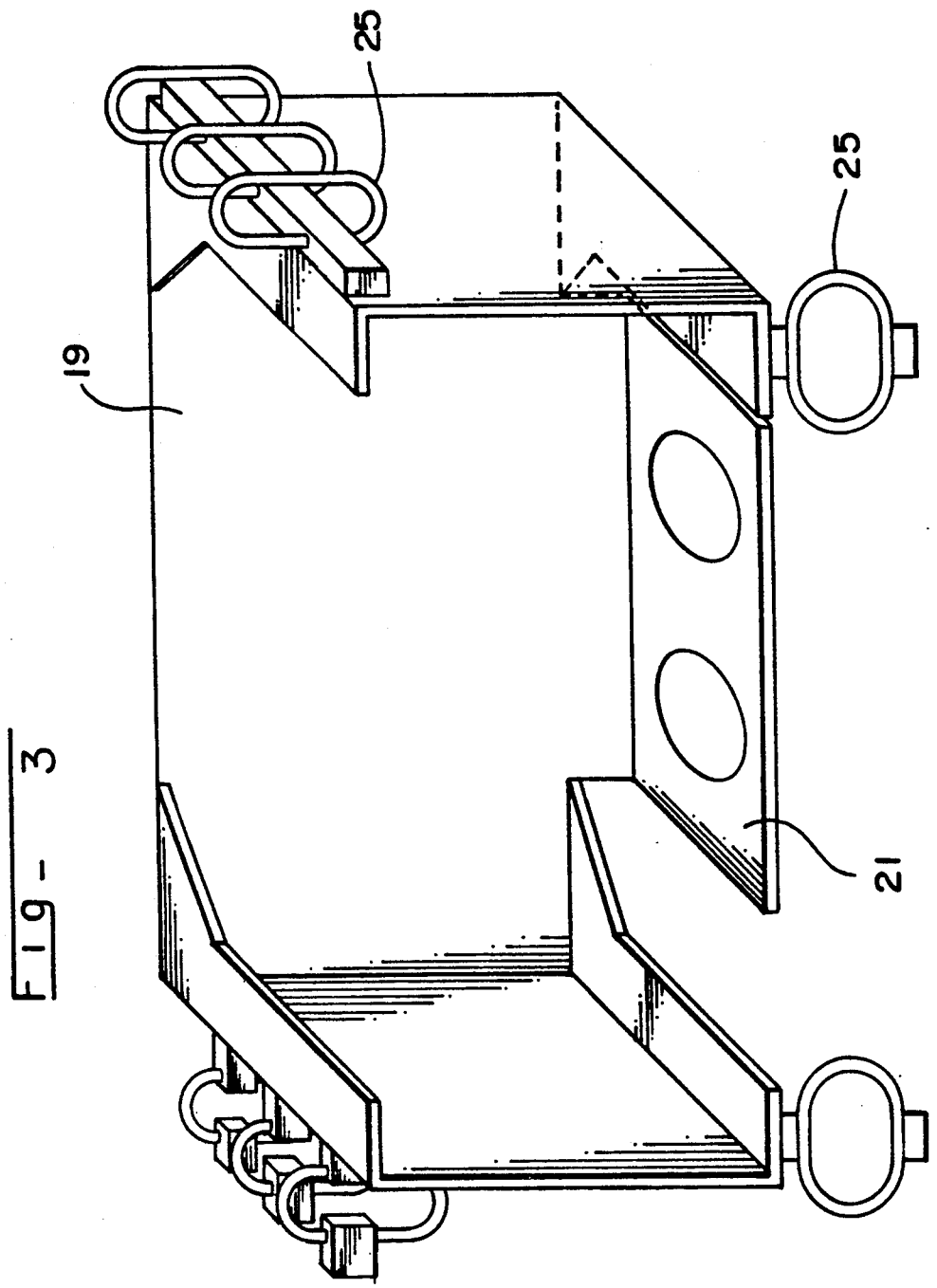

PROTECTIVE CASE FOR AN INDUSTRIAL CONTROLLER

BACKGROUND OF THE INVENTION

The invention relates to a protective case for an electronic device such as an industrial process controller or a controller on board a naval vessel or land vehicle, providing protection against shocks, external disturbances and over-heating, comprising a sealed metal housing inside which said controller is fixed by means of mechanical dampers, leaving an insulating gap between the case and controller.

The invention is based on the observation that there exists today a range of products specifically designed for use in an industrial environment, or other exceptional ambient conditions, such as those to be found on board military vehicles on land or at sea.

Standard devices are incapable of operating correctly when they are subjected to mechanical shocks and vibrations, and to pollution by dust particles which rapidly destroy or damage the electronic components. Electromagnetic disturbances generated by neighboring electrical equipment, or by the main system, also disturb correct operation of electronic devices. In addition, dedicated equipment is often too costly for non-vital applications.

By housing the electronic device or industrial controller in a sealed metal enclosure, shocks and dust, and to a certain extent the influence of ambient magnetic and electromagnetic fields, can be avoided, but cooling of the device is hindered by this sealed enclosure.

The object of the present invention is to achieve a particularly simple and efficient protective case, enabling a standard electronic device to be used in a harsh environment, notably in an industrial environment.

SUMMARY OF THE INVENTION

The protective case according to the invention is characterized in that a fan, housed in the sealed case, generates an air flow in a gap inside the case to keep the temperature in the latter uniform, and to improve cooling by the external metal housing.

The air flow induced by the fan in the insulating gap between the electronic device, hereinafter called controller, and the case favors convection cooling of the controller, the heat being transmitted to the metal housing of the case, which transmits this heat to the ambient environment.

The internal air flow does not affect the tightness of the case and favors homogeneity of the controller temperature.

The case advantageously comprises controller input and output cable connectors, which are arranged as sealed bushings and electrical filters preventing disturbances and noise from being transmitted to the inside of the case. The metal housing and filter connectors ensure electromagnetic compatibility and enable the controller to be used in electrically disturbed environments.

It is advantageous to secure the standard controller to a support cradle, for example made of metal, to which the internal air circulation fan or fans are rigidly affixed. The cradle is itself fixed to the case by dampers leaving an air gap over the whole circumference of the controller, preventing any mechanical contact of the controller with the wall of the case. For reasons of size, the shape of the protective case corresponds appreciably to that of the controller, but it is clear that a case can be designed for a range of controllers of different sizes, the volume being in some cases larger. One of the faces of the case, generally of parallelipipedic shape, is arranged as a removable cover which gives access, after it has been removed, to the fixing bolts of the dampers and to the wiring connectors, to enable the controller to be mechanically and electrically disconnected and removed.

BRIEF DESCRIPTION OF THE DRAWINGS

Other advantages and features will become more clearly apparent from the following description of an illustrative embodiment of the invention, given as a non-restrictive example only and represented in the accompanying drawings, in which:

FIG. 3 is a perspective view of the cradle for supporting the controller.

DESCRIPTION OF THE PREFERRED EMBODIMENT

Figure 1:
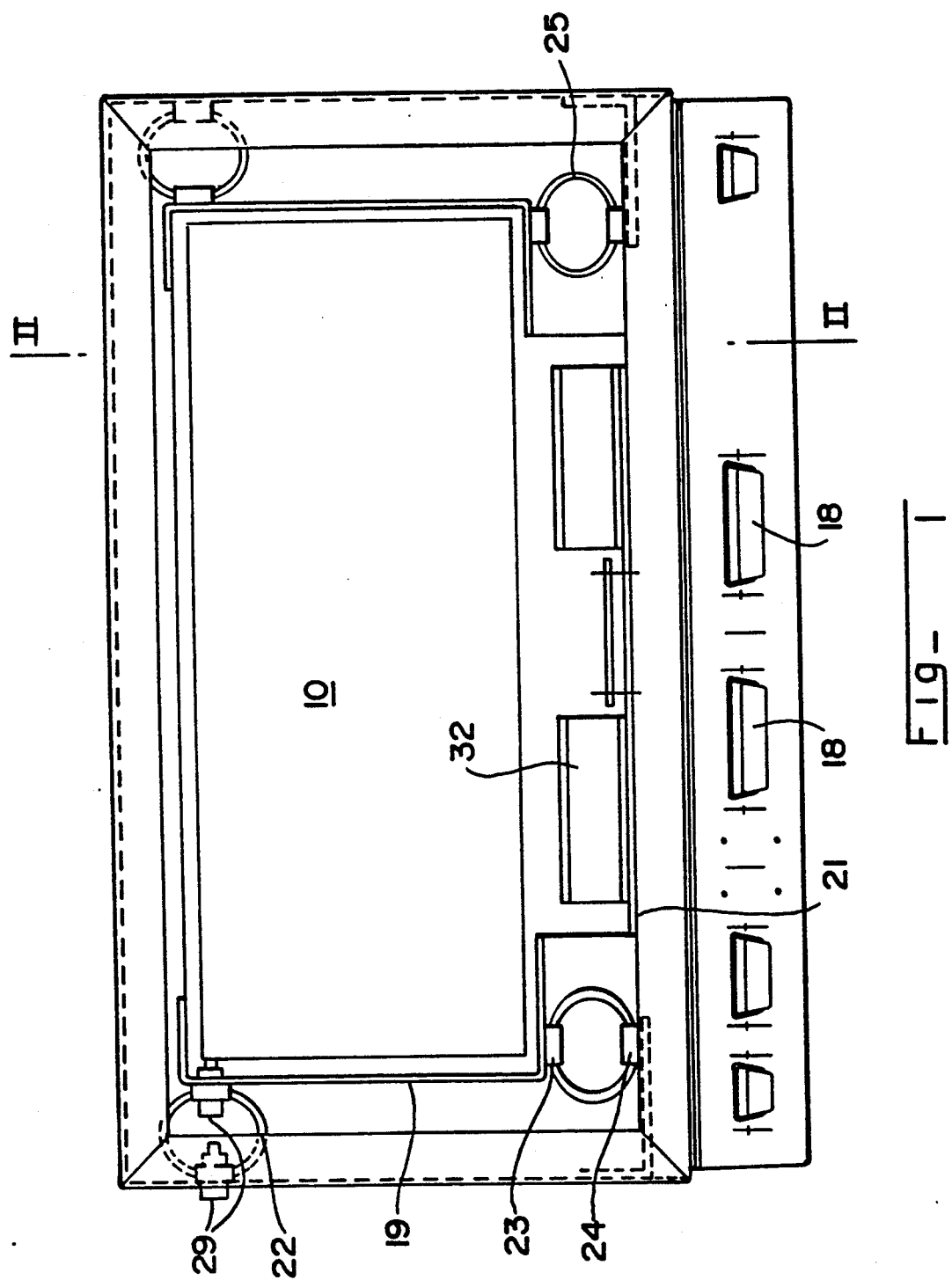
FIG. 1 is a schematic plan view of a protective case according to the invention, with the cover being assumed to have been removed.
Figure 2:
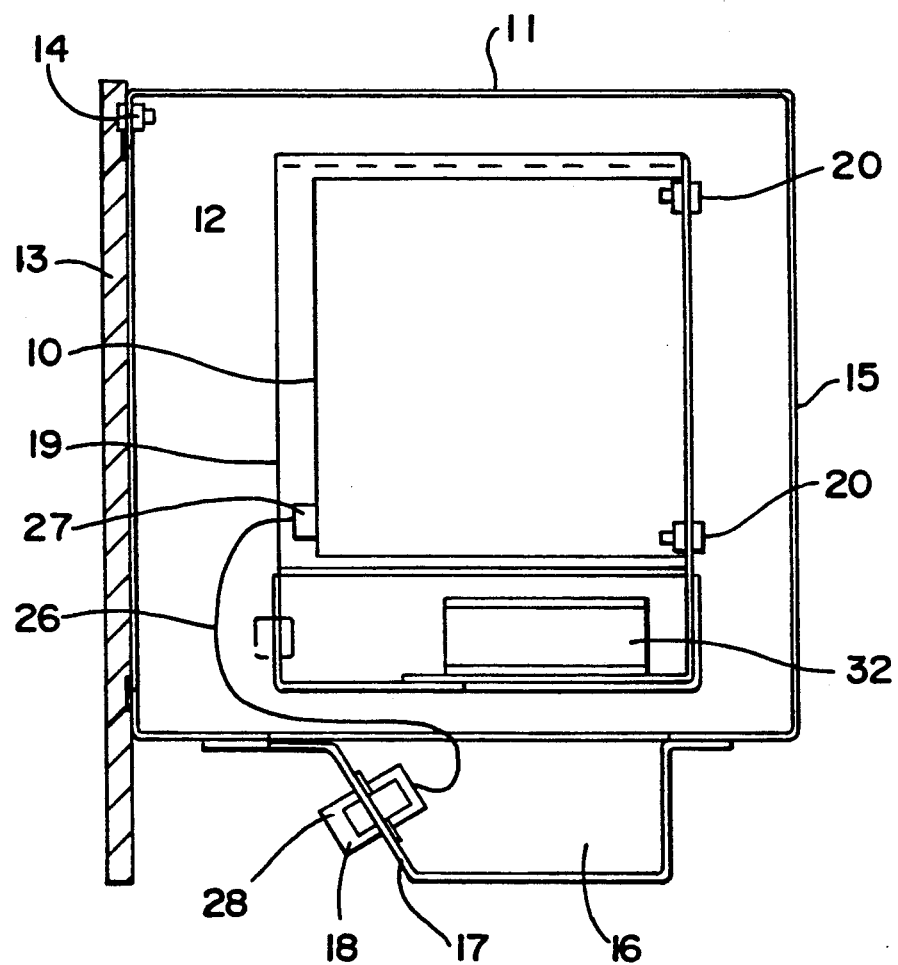
FIG. 2 is a cross-sectional view along the line II—II of FIG. 1.

In the Figures, a controller 10, represented by its external parallelipipedic contour, is housed inside a case 11 of conjugate shape. The dimensions of the case 11 are greater than those of the controller 10, so as to leave on all the faces a gap 12 preventing any mechanical contact between the controller 10 and case 11. The metal case 11 is tightly sealed at the top by a metal plate 13, secured by nuts and bolts 14, to form a cover giving access to the inside of a case after it has been removed. The opposite end plate 15 can also be arranged as a removable plate forming the fixing base of the case. The front panel of the case 11 has an appendix 16 having an inclined face 17 bearing connectors 18.

The controller 10 is securedly affixed by nuts and bolts 20 to a cradle 19, made up of steel sections or plates surrounding the controller 10 with a small clearance on all its sides except the one facing the cover 13. The cradle 19 is extended on the front panel side by a support 21 for two fans 32. The cradle 19 is itself fixed to the housing of the case 11 by nuts and bolts 29 and dampers 22 constituted by two fixing plates 23, 24, connected by flexible strips 25. The dampers 22 can naturally be of any type, their arrangement and number being sufficient to position the assembly flexibly inside the case 11 preventing any mechanical contact between the controller 10 and case 11, and absorbing the shocks and vibrations which could be transmitted by the case 11 to the controller 10. The use of a cradle 19 enables the dampers 22 to be suitably arranged, this arrangement being totally independent from the standard fixing means of the controller 10. The assembly comprising the controller 10, cradle 19 and fan 32 forms an assembly or block which can be removed from the case 11 after the cover 13 has been removed and the dampers 22 disconnected. The connectors 18 are connected by wiring 26 to the connecting terminal 27 of the controller 10, and this wiring must naturally also be disconnected when the controller 10 is separated from the case 11. The connectors 18 which are inputs and outputs of the controller, and the power supplies to the latter comprise, if necessary, electrical filters 28, well-known as such, preventing any transmission of disturbances to the controller 10 or vice-versa to the outside.

The controller 10 is separated from the case 11 by the air gap 12. The only connections to controller 10 are the dampers 22 and wiring 26, which are incapable of transmitting shocks or other harmful disturbances to the controller 10. The fan or fans 32 ensure an air flow inside the case 11, notably in the gap 12, and keeps the temperature inside the case 11 uniform, and a flow between the controller 10, or more particularly the hot parts of the controller 10, and the metal housing of the case 11. This air flow prevents the gap 12 from forming a thermal insulation which would prevent efficient cooling of the controller 10. This cooling is achieved without discontinuity of the leak-proof seal of the case 11, preventing any risk of disturbances or pollution reaching the controller 10. The degree of protection can be adjusted to the operating conditions, but in all cases, the means implemented are simple and inexpensive.

It is clear that the fan 32 can also be fixed to the housing of the case 11, or that the cradle 19 can be simplified and be arranged as a simple frame extending between the fixing points of the dampers 22 and those of the controller 10. The case according to the invention has the advantage of being able to be adapted to all types of electronic devices or controllers, and can be used if required with a range of equipment which is not necessarily parallelipipedic in shape.

The invention is naturally in no way limited to the embodiment particularly described herein.

We claim:
1. A protective sealed metal housing with an electronic device, comprising:
   an assembly including a support cradle fixed to and supporting the electronic device;
   the sealed metal housing enclosing said assembly, said support cradle being fixed to said sealed metal housing via mechanical dampers to isolate said assembly from external disturbances including shocks, wherein a gap is formed between the assembly and the sealed metal housing; and
   a fan fixed to said cradle for generation of air flow in said gap to promote convection heat transfer from said electronic device to said sealed metal housing.

2. The protective housing of claim 1, further comprising an electrical connector sealed to said sealed metal housing, wherein said electrical connector is electrically connected by wiring to a connecting terminal of said electronic device, and wherein said electrical connector comprises electrical filters to prevent electrical disturbances to be transmitted to the electronic device.

3. The protective housing of claim 1, wherein the sealed metal housing is parallelipipedic in shape and comprises a removable cover, said mechanical dampers being fixed to said support cradle with bolts to allow removal of said assembly from said sealed metal housing after removing said removable cover.

4. The protective housing of claim 1, wherein the electronic device is housed by a box which is fixed to said cradle by bolts, and wherein said cradle substantially conforms to an outer shape of said box.

* * * * *